United States Patent
Orlik et al.

(10) Patent No.: US 8,245,116 B2
(45) Date of Patent: Aug. 14, 2012

(54) METHOD FOR PERFORMING SOFT DECISION DECODING OF EUCLIDEAN SPACE REED-MULLER CODES

(75) Inventors: Philip Orlik, Cambridge, MA (US);
Raymond Yim, Cambridge, MA (US);
Kieran Parsons, Cambridge, MA (US);
Vahid Tarokh, Cambridge, MA (US);
Jinyun Zhang, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 64 days.

(21) Appl. No.: 13/007,435

(22) Filed: Jan. 14, 2011

(65) Prior Publication Data
US 2012/0185755 A1    Jul. 19, 2012

(51) Int. Cl.
*H03M 13/00* (2006.01)
(52) U.S. Cl. ............................................. 714/780
(58) Field of Classification Search .............. 714/746, 714/780, 786, 792, 795
See application file for complete search history.

(56) References Cited

U.S. PATENT DOCUMENTS

| | | | | |
|---|---|---|---|---|
| 7,010,051 | B2 * | 3/2006 | Murayama et al. | 375/262 |
| 7,331,012 | B2 * | 2/2008 | Vasic et al. | 714/781 |
| 7,689,888 | B2 * | 3/2010 | Kan et al. | 714/758 |
| 7,756,424 | B2 * | 7/2010 | Turpin et al. | 398/201 |

OTHER PUBLICATIONS

Tokina et al., A new decoding algorithm for Reed Muller codes, Sep. 1982, IEEETrans. on Info. Theory, vol. IT-28, No. 5, p. 779-787.*
Schnabl et al., Soft decision decoding of Reed Muller codes as generalized multiple concatenated codes, Jan. 1995, IEEE, Trans. on Info. Theory, vol. 41, No. 1, p. 304-308.*
Gopalan, A fourier analytic approach to Reed Muller decoding, Apr. 2009, ECCC, Electronic Collquimon Computational Complexity, Report No. 37, p. 0-31.*

* cited by examiner

*Primary Examiner* — Shelly A Chase
(74) *Attorney, Agent, or Firm* — Dirk Brinkman; Gene Vinokur

(57) ABSTRACT

Soft decision decoding of a codeword of a Reed-Muller (RM) code by
selecting an optimal decomposition variable i using a likelihood calculation. A code RM(r, m) is expressed as $\{(u, uv) | u \in RM(r, m-1) \text{ and } v \in RM(r-1, m-1)\}$, where uv denotes a component-wise multiplication of u and v, and $(u, uv) = (r^1, r^2)$. A receive codeword is separated into $r^1 = u$ and $r^2 = uv$ based on the optimal decomposition variable, and $r^2$ is decoded according to the optimal decomposition variable, using a RM(r-1, m-1) decoder to obtain a decoded v and a first set of decoded bits. The decoded v is combined with $r^1$ using $(r^1 + r^2 v)/2$, and $(r^1 + r^2 v)/2$ is decoded using a RM(r, m-1) decoder to obtain a decoded u and a second set of decoded bits.

11 Claims, 6 Drawing Sheets

100

METHOD FOR PERFORMING SOFT DECISION DECODING OF EUCLIDEAN SPACE REED-MULLER CODES

FIELD OF THE INVENTION

This invention relates generally to error correction coding, and more particularly to decoding soft information from receive signals

BACKGROUND OF THE INVENTION

Optical Communication Network

Latency is a major issue in high speed communication networks, such as optical networks. This makes the trade-off between latency, complexity of implementation and coding gain important in the selection of channel codes. In many cases, the use of any coding technique can only provide gain at the expense of additional decoding and encoding complexity and increased latency. It is important to find coding techniques that provide sufficient gains, while keeping the encoding and decoding complexity low.

Reed-Muller (RM) Codes

Polar codes, see U.S. Pat. No. 7,756,424, "Optical CDMA communications system using OTDL device, have been used optical in fiber optic communications systems, to make more efficient use of the available bandwidth. Reed Muller codes, a subset of polar codes, can be used to achieve performance close to capacity limit predicted by the Shannon limit. Reed Muller decoders use linear error-correcting codes. Reed-Muller (RM) codes belong to the classes of locally testable codes, and locally decodable codes. RM codes are useful in the design of probabilistically checkable proofs in communication applications. Special cases of Reed-Muller codes include Hadamard codes, and Walsh-Hadamard codes.

It is known that RM codes have an elegant construction based on polynomials with specific structure. Higher order RM codes can be constructed recursively from lower order RM codes. This enables a decoding process that has complexity that is thousands of times smaller than other error correcting codes with similar performance, such as Reed Solomon codes.

Soft Decision Decoding

As known in the art, a hard-decision decoder decodes data that have a fixed set of discrete possible values, typically 0 or 1.

A soft-decision decoder decodes data that have been encoded with an error correcting code, and the data take on a range of continuous values from 0 to 1. The extra information indicates reliability (probability) of each input data point, and is used to form better estimates of the original data. Therefore, a soft-decision decoder typically performs better in the presence of corrupted data than hard-decision counterparts.

There are two types of soft decision decoders. First, a maximum likelihood (ML) decoder determines the probability that a specific codeword has been sent over a channel. Second, a maximum a posteriori (MAP) decoder determines the probability that information bit has been used to generate a codeword to be sent over a channel.

SUMMARY OF THE INVENTION

Embodiments of the invention provide a method for decoding soft information of Reed Muller that show superior performance over existing schemes.

DETAILED DESCRIPTION OF THE PREFERRED EMBODIMENT

Figure 1:
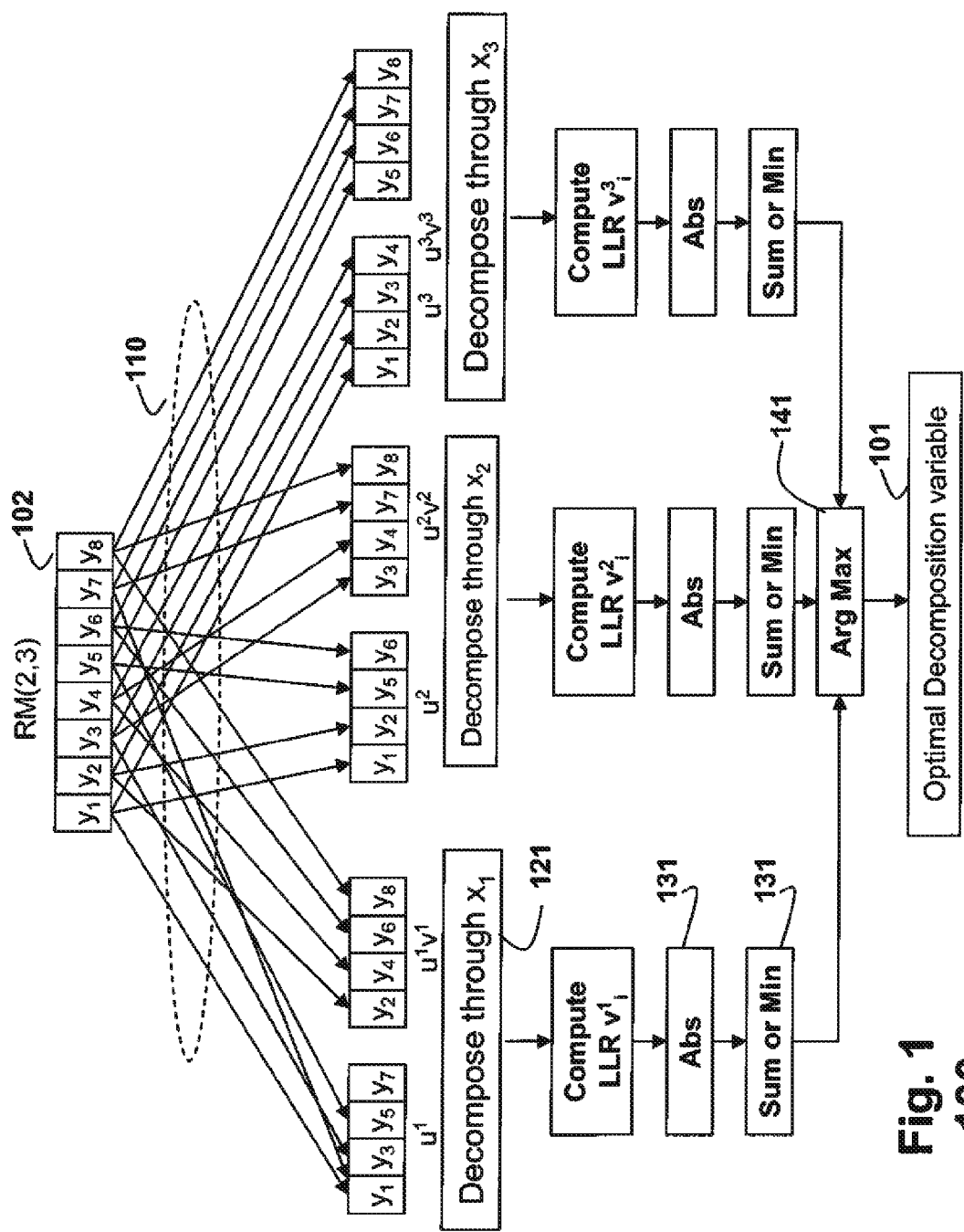
FIG. 1 is a schematic of a method for finding the optimal decomposition variable according to one embodiment of the invention.

The embodiments of the invention provide a method for performing soft decision decoding of Euclidean space Reed-Muller (RM) codes. The steps of the methods and procedures shown in FIGS. 1-6 can be performed in a processor connected to a memory and input/output interfaces as known in the art.

A code RM(r, m) of order r and codewode of length $2^m$ is a set of all binary vectors associated with coefficients of a Boolean polynomial with m variables, and whose terms are composed of monomials of degree r. A monomial is a product of powers of variables, or formally any value obtained by finitely many multiplications of a variable.

Such a code has $$1 + \binom{m}{1} + \ldots + \binom{m}{r}$$

valid codewords, and a minimum Hamming distance of $2^{m-r}$. The mappings, $0 \Rightarrow 1$ and $1 \Rightarrow -1$ are used to transmit the RM(r, m) codewords using, e.g., binary phase-shift keying (BPSK) symbols. The function $$\binom{n}{k}$$

is the binomial coefficient, or the number of ways to construct a set of k elements from a larger set of n elements.

Maximum Likelihood Decoding

Maximum Likelihood Decoding of First Order Reed-Muller Codes and Hadamard Transform The polynomial of a RM(1, m) code is $1+X_1+\ldots+X_m$. The RM(1, m) code has the property that each of the code words, after BPSK mapping, is a row in the Hadamard matrix $H_{2^m}$, or $-H_{2^m}$. Thus, the encoder maps the input bit sequence, $b_1, b_2, \ldots, b_{m+1}$, as follows. The encoder first examines the m least significant bits $b_2, \ldots, b_{m+1}$ and computes the decimal representation of this binary number. This produces the index $i=b_2 2^0 + b_3 2^1 + \ldots + b_{m+1} 2^{m-1}$. Then, the encoder transmits the $i^{th}$ row of $H_{2^m}$ if $b_0=0$, or the $i^{th}$ row of $H_{2^m}$ if $b_0=1$.

The decoder examines the received vector with $2^m$ coordinates. The m variables form an orthogonal subspace, and can be detected by the Hadamard transform, and the presence of a constant one negates the result of the Hadamard transform.

Let Y be the received vector, and $H_{2^m}$ be the Hadamard matrix of size $2^m \times 2^m$, the decoder determines the likelihood $L = H_{2^m} Y$. It is assumed that the received vector Y is the transmitted codeword, which has been corrupted by additive white Gaussian noise with zero mean and noise variance $\sigma^2$.

Let $L_i$ be the value of the $i^{th}$ element in the likelihood L. Then, the decoder determines $\hat{i} = \arg\max_i L_i$, where the function arg max returns the index that obtains the maximum value. The sign of $L_i$ gives $\hat{b}_1$. The binary expansion of the index $\hat{i}$ indicates which variable is present, and thus gives estimates of the values of $\hat{b}_2$ to $\hat{b}_{m+1}$.

Maximum Likelihood Decoding of Decoding RM(m, m)

A generator matrix G of a code RM(m, m) is full rank and invertible in a Galois field of two elements (GF(2)). Hence, the decoder performs matrix inversion of G to obtain $G^{-1}$, and multiplies the received vector after threshold operation by $G^{-1}$ in modulo 2 arithmetic.

Maximum Likelihood Decoding of Higher Order Reed-Muller Codes and Recursive Decomposition Given the two procedures above for decoding RM(1, m) and RM(m, m) codes, we can now recursively decode of general RM(r, m) codes. We note that the RM(r, m) code can be decomposed into RM(r−1, m−1) and RM(r, m−1) codes, via the well known Plotkin decomposition.

Thus, after BPSK mapping, we can express RM(r, m) as RM(r, m)={(u, uv)|uγRM(r, m−1) and v∈RM(r−1, m−1)}, where uv denotes a component-wise multiplication of u and v. Hence, depending on the choice of decomposition variable $x_j$, j=1, 2, ..., in, the codewords of RM(r, m) can be written after applying the appropriate permutation as $$(u^j, u^j v^j) = (r^1, r^2),$$

where the superscript j is used to denote that the variable $x_j$ was used in the Plotkin decomposition. We use $u^j_i$ and $u^j_i v^j_i$ to denote the $i^{th}$ coordinates of $r^1$ and $r^2$. The log-likelihood ratio (LLR) of $u^j_i$, $LLR(u^j_i)$ can be determined from $r^1_i$. Similarly, the log-likelihood ratio of $u^j_i v^j_i$, $LLR(u^j_i v^j_i)$, can be determined from $r^2_i$. Because $v^j_i = u^j_i(u^j_i v^j_i)$, the log-likelihood of $v^j_i$, $LLR(v^j_i)$ can be expressed in terms of $LLR(u^j_i)$ and $LLR(u^j_i v^j_i)$ as $$LLR(v^j_i) = \log((\exp(LLR(u^j_i) + LLR(u^j_i v^j_i)) + 1) / \exp(LLR(u^j_i)) + \exp(LLR(u^j_i v^j_i)))).$$

Because we have a procedure to compute the $LLR(v^j_i)$ we can perform decoding of $v^j$. This is accomplished by generating a received vector r*, which has the same LLR values as $v^j$. Thus, r* corresponds to the received codeword, assuming that $v^j$ was transmitted. This is done by setting $r_i^* = LLR(v^j_i) \sigma^2/2$ for i=1, 2, ..., $2^{m-1}$. We assume that we have a RM(r−1, m−1) decoder, and we pass r* through this decoder to obtain $v^j$.

While there are m variables that can be used to perform the Plotkin decomposition, there is an optimal decomposition variable then is $X_{\hat{j}}$ such that $$\hat{j} = \arg\max_j \sum_i |LLR(v^j_i)|,$$

where the function arg max returns a maximum absolute value. The above choice of $\hat{j}$ maximizes the probability of correct detection of $v^j$.

As a variation that results in a lower performance for the ML decoder, it is possible to use $$\hat{j} = \arg\max_j \min_i \sum_i |LLR(v^j_i)|,$$

where the function arg max min returns the maximum index j, and the minimum index i for the absolute value, (|•|), of $v^j_i$.

The prior art does not determine the LLR for the decomposition variable, and does not use the absolute value (abs) function, and finding a maximum. There are two variations that can be used depending on whether we use a maximum likelihood (ML), or maximum a posteriori (MAP) decoder. We can insert a 'sum' function between the max and abs function, or insert a 'min" function between the max and abs function.

FIG. 1 is a schematic of the procedure 100 to determine the optimal decomposition variable 101. For example, for the code RM(2, 3) 102, three variables are used in the polynomial construction of the code. That means there are three possible decomposition variables, $X_1$, $X_2$, $X_3$.

The procedure rearranges 110 bits $y_1$–$y_8$ corresponding to each decomposition variable to obtain $u^j$ and $u^j v^j$ for j=1, 2 and 3.

For each of the decomposition variable, the procedure determines the LLR $v^j_i$. The abs function 131 is applied to all computed $v^j_i$, and a sum or min function 141 is then applied to the index i. The decomposition variable index j that corresponds to the largest value, as determined by the arg max function 141, is then the optimal decomposition variable 101.

Because we now have $v^j$, we can compensate for it in $r^2$ by computing $r^2 v^j$. We can form the input to the RM(r, m−1) decoder as $(r^1 + r^2 v^j)/2$.

Now, v can be decoded using the RM(r−1, m−1) decoder. After v is decoded, two observations exist for u, one for $r^1$ and one with $r^2$ v. For a Gaussian distributed channel, the two observations can be averaged, and the RM(r, m−1) decoder can be used to decode u. The process can be recursively applied.

Figure 2:
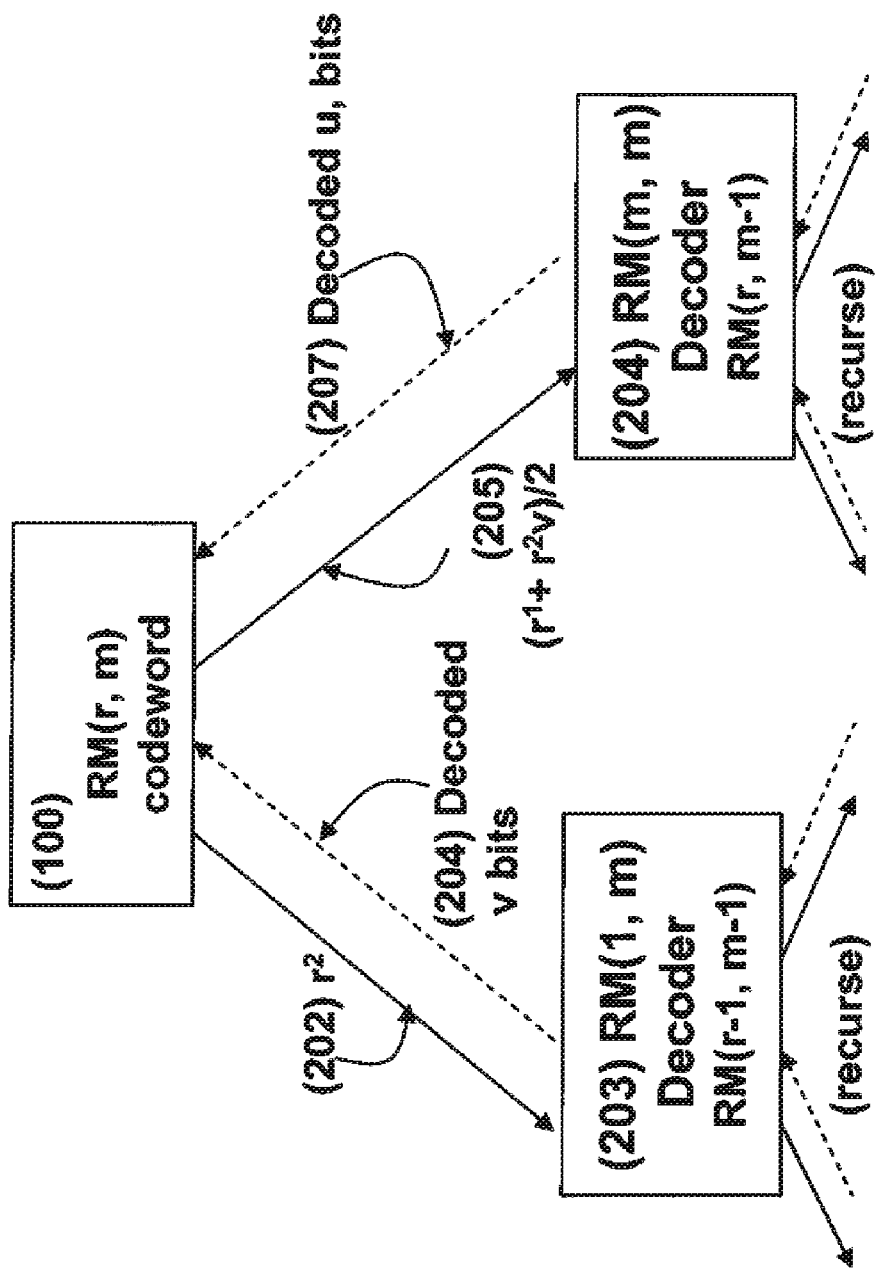
FIG. 2 is a schematic of a decoding method for Reed Muller codes according to one embodiment of the invention.

FIG. 2 shows this process schematically. After the optimal decomposition variable is determined 100 for the code RM(r, m) according to the procedure shown in FIG. 1, half of the bits corresponding to $r^2$ 202 are decoded using a RM(r−1, m−1) decoder 203. Depending on the code order r, RM(r−1, m−1) 203 can require further recursion for decoding the subcode $r^2$, or if r−1=1 (equivalently, r=2). A Hadamard transform can be used to decode the subcode $r^2$.

The RM(r−1, m−1) decoder returns both a decoded v 204 and a first set of corresponding undecoded bits. The decoded v are used to estimate u by determining $(r^1 + r^2 v^j)/2$ 205. The compute vector is decoded using an RM(r, m−1) decoder 206. If r=m−1, subcode $(r^1 + r^2 v^j)/2$ can be decoded using matrix inversion. Otherwise, further recursion is used to decode the subcode. The RM(r, m−1) decoder returns decoded bits u 207, and a second set of corresponding undecoded bits.

Figure 3:
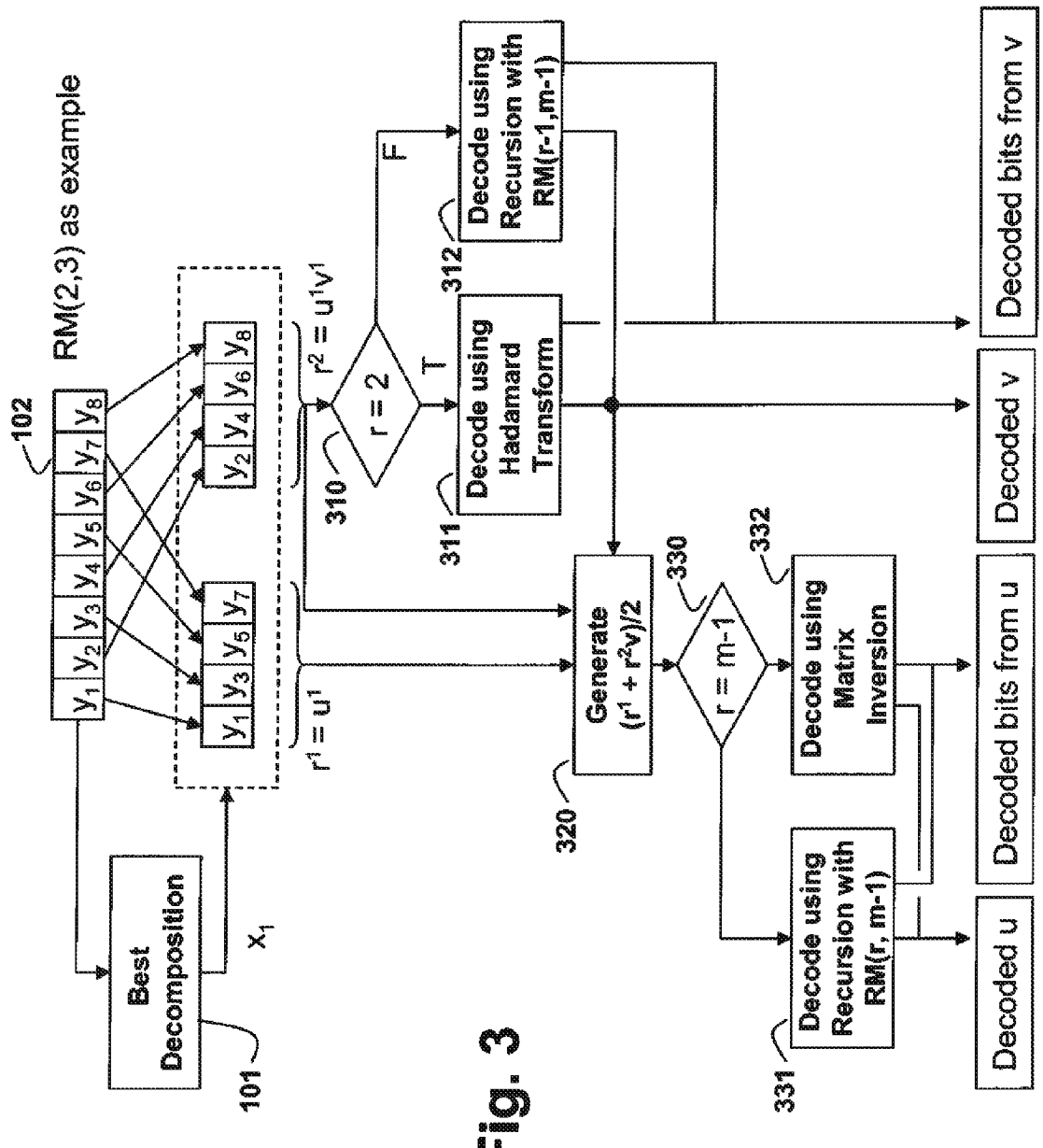
FIG. 3 is another schematic of a decoding method for Reed Muller codes according to one embodiment of the invention.

FIG. 3 shows a more detailed schematic of the procedure. First, the procedure determines the optimal decomposition variable $x_{\hat{j}}$ 101 by decomposing RM(r, m) can be into RM(r−1, m−1) and RM(r, m−1) using a the Plotkin decomposition and the choice of decomposition variable $X_{\hat{j}}$ described above.

Then, the procedure determines 310, if $r^2$ is currently decodable. The input $r^2$ from the Plotkin decomposition, corresponding to RM(r−1, m−1), is currently decodable if (r−1=1).

If true, then the maximum likelihood decoder for the RM(1, m−1) decoder based the Hadamard transform 311 is used to decode $v^j$ using input r2.

If r−1>1, then the Plotkin decomposition 312 is recursed, this time on the RM(r−1, m−1), and the input $r^2$.

After $v^j$ is obtained we can proceed to generating the input for the RM(r, m−1) decoder. This is generated as $(r^1+r^2 v^j)/2$ 320.

If the RM(r, m−1) code satisfies the condition that r=m−1 then the input, $(r^1+r^2 v^j)/2$, can be decoded to generate $u^i$ using the generator matrix of the RM(m−1, m−1) code described above.

Check 330 if r<m−1. If true, then the Plotkin decomposition is carried out again this time on the RM(r, m−1) code 331 and input $(r^1+r^2 v^j)/2$. Otherwise, decode using a matrix inversion 332.

Maximum Likelihood List Decoding with Optimal Decomposition

Maximum likelihood decoding usually finds the codeword and the corresponding undecoded bit pattern that is most similar to the received signal. In some applications, it can be useful to find not only the single similar codeword, but also multiple code words.

Figure 4:
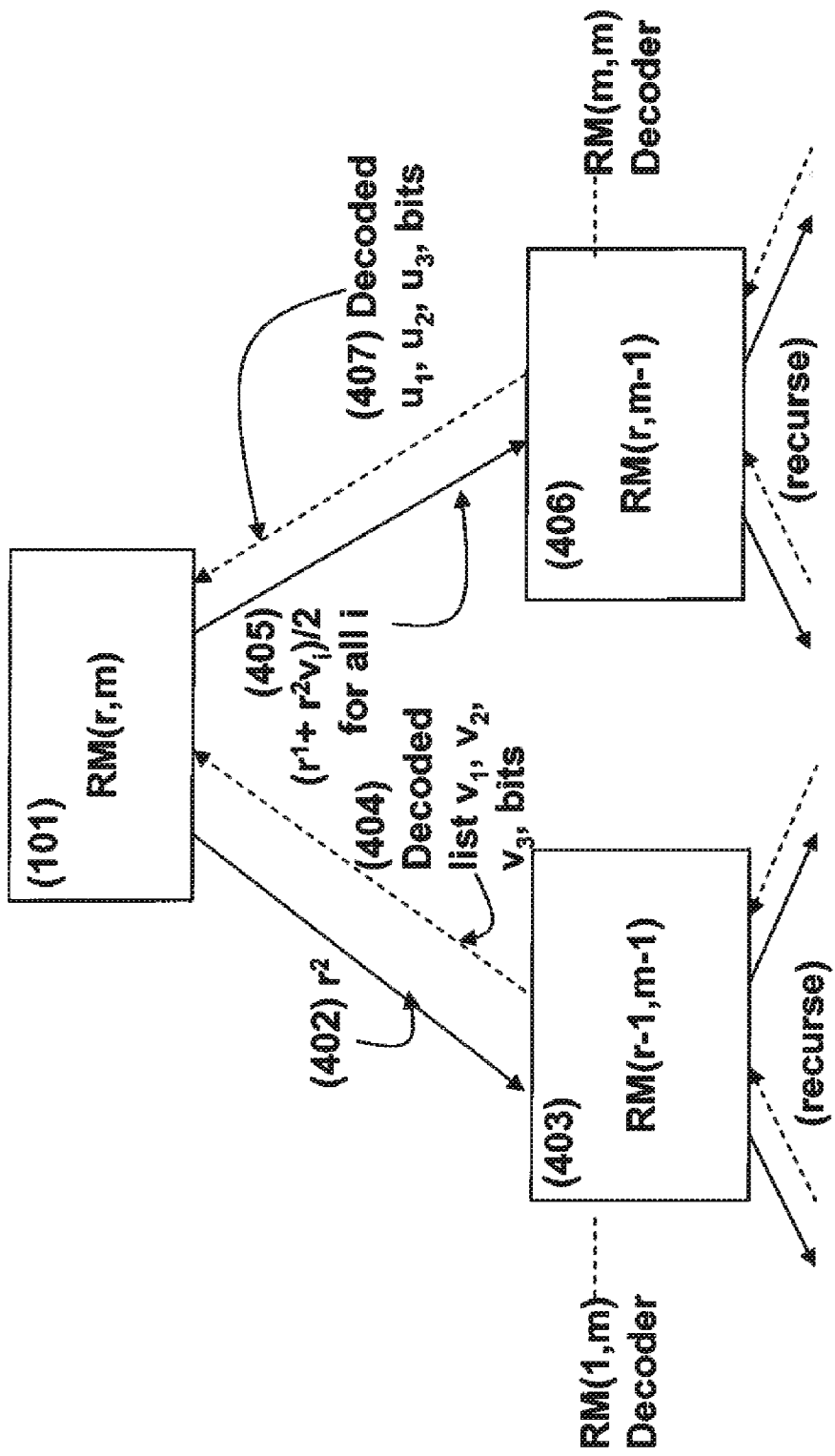
FIG. 4 is a schematic of a decoding method for Reed Muller codes according to another embodiments of the invention.

To do so, as shown in FIG. 4, the decoder for RM(r−1, m−1) 403 determines a small set of the number of closest code words. For example, in the RM(1, m) case, this can be done by the following.

After the optimal decomposition variable is determine 101 according to FIG. 1, half of the bits corresponding to $r^2$ 402 are decoded using an RM(r−1, m−1) decoder 403. Depending on value of r, RM(r−1, m−1) can require further Hadamard transform can be used to decode the subcode $r^2$. The RM(r−1, m−1) decoder returns multiple decoded $v_i$ 404, and the corresponding undecoded bits.

The decoded $v_i$ are used to estimate $u_i$ by computing $(r^1+r^2 v_i)/2$ 405. For each of the estimate (iterate over all i), the compute vector is decoded using the RM(r, m−1) decoder 406. If r=m−1, subcode $(r^1+r^2 v_i)/2$ can be decoded using matrix inversion. Otherwise, further recursion is used to decode the subcode. The RM(r, m−1) decoder returns decoded u 407, and the corresponding undecoded bits.

List Hadamard Transform

Let Y be the received vector, and $H_{2^m}$ be the Hadamard matrix. The decoder determines the likelihood $L=H_{2^m} Y$. Let $L_i$ be the value of the $i^{th}$ element in L, then the decoder finds multiple $\hat{i}$'s which corresponds to a set of the values in L. For each $\hat{i}$, the sign of $L_{\hat{i}}$ gives $\hat{b}_1$. The index $\hat{i}$ indicates which variable is presence, and thus value of $\hat{b}_2$ to $\hat{b}_{m+1}$. All bit patterns for each correspond to a codeword. These can then be used to find $v_1$, $v_2$, and so on.

With each $v_i$, $(r^1+r^2 v_i)/2$ are determined, and passed to the RM(r, m−1) decoder. Each of these vectors can be used to decode the corresponding bits, $u_i$ vector.

Figure 5:
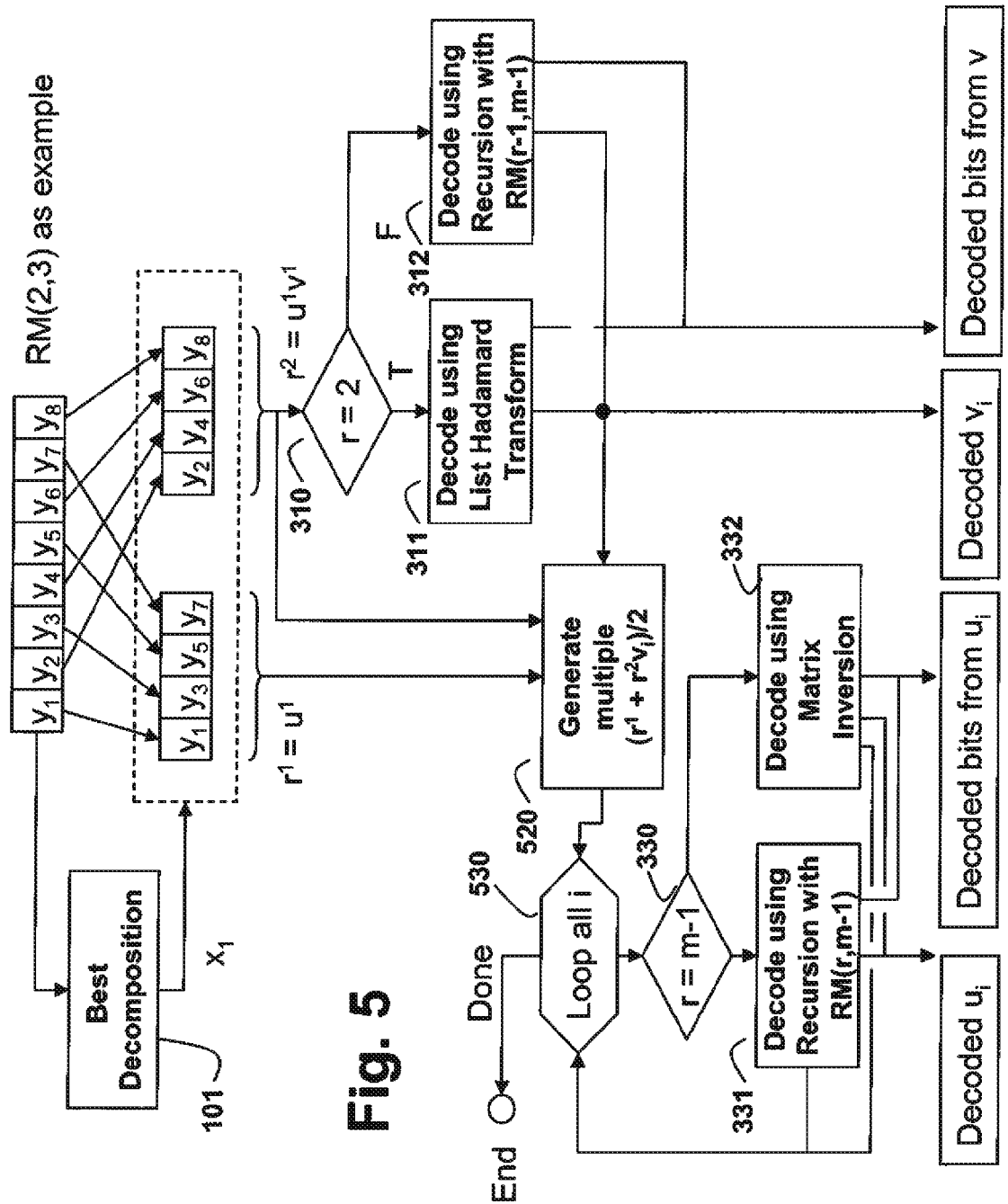
FIG. 5 is another schematic of a decoding method for Reed Muller codes according to another embodiments of the invention.

FIG. 5 shows a more detailed schematic of the procedure. The procedure is very similar to FIG. 3. The exception is that a list Hadamard decoder is used to find the few closest $v_i$'s when r=2. Because multiple $v_i$ are returned, the procedure determine multiple $(r^1+r^2 v_i)/2$ 520, and the procedure loops 530 over all i using these vectors to decode multiple $u_i$.

Maximum A Posteriori (MAP) Decoding

In the prior art, a MAP only operates on for codewords, and not individual bits. The embodiments of the invention provide a method for bit-level MAP decoding. An exact MAP decoder is provide for RM(1, m) and RM(m, m), and an approximated MAP decoder is provide for higher order RM codes. In addition, we also provide a fast MAP decoder based on a list maximum likelihood (ML) decoder.

MAP Decoder for RM(1, m)

Let r be the received bit, $\sigma^2$ be the noise variance and $H_{2^m}$ be the Hadamard matrix. Then, the log likelihood of the bits LLRbit can be determined using the following pseudocode:

$$LLRrow = H_{2^m} r / \sigma^2$$

$$expLL = exp(LLRrow) + exp(-LLRrow)$$

$$LLRbit(1) = log(sum(LLRrow)/sum(-LLRrow))$$

$$LLRbit(2:end) = log((1-A)expLL/(A.expLL))$$

where A is a matrix of all binary vectors.

MAP Decoder for RM(m, m)

Let r be the received bit, $\sigma^2$ be the noise variance and $c_i$ for i=1, 2, ..., $2^m$, be all binary vectors. We first determine the likelihood of every $c_i$ given r and $\sigma^2$, which is well known based on probability theory. After that, we note that c−Gb in modulo 2, where G is the generator polynomial, and b is the undecoded bits. It is easy to determiner inverse of G in modulo-2 arithmetic. Using the likelihood of $c_i$ and inverse of G, one can then determine the MAP of each bit.

MAP Decoder for Higher Order Reed Muller Code

Figure 6:
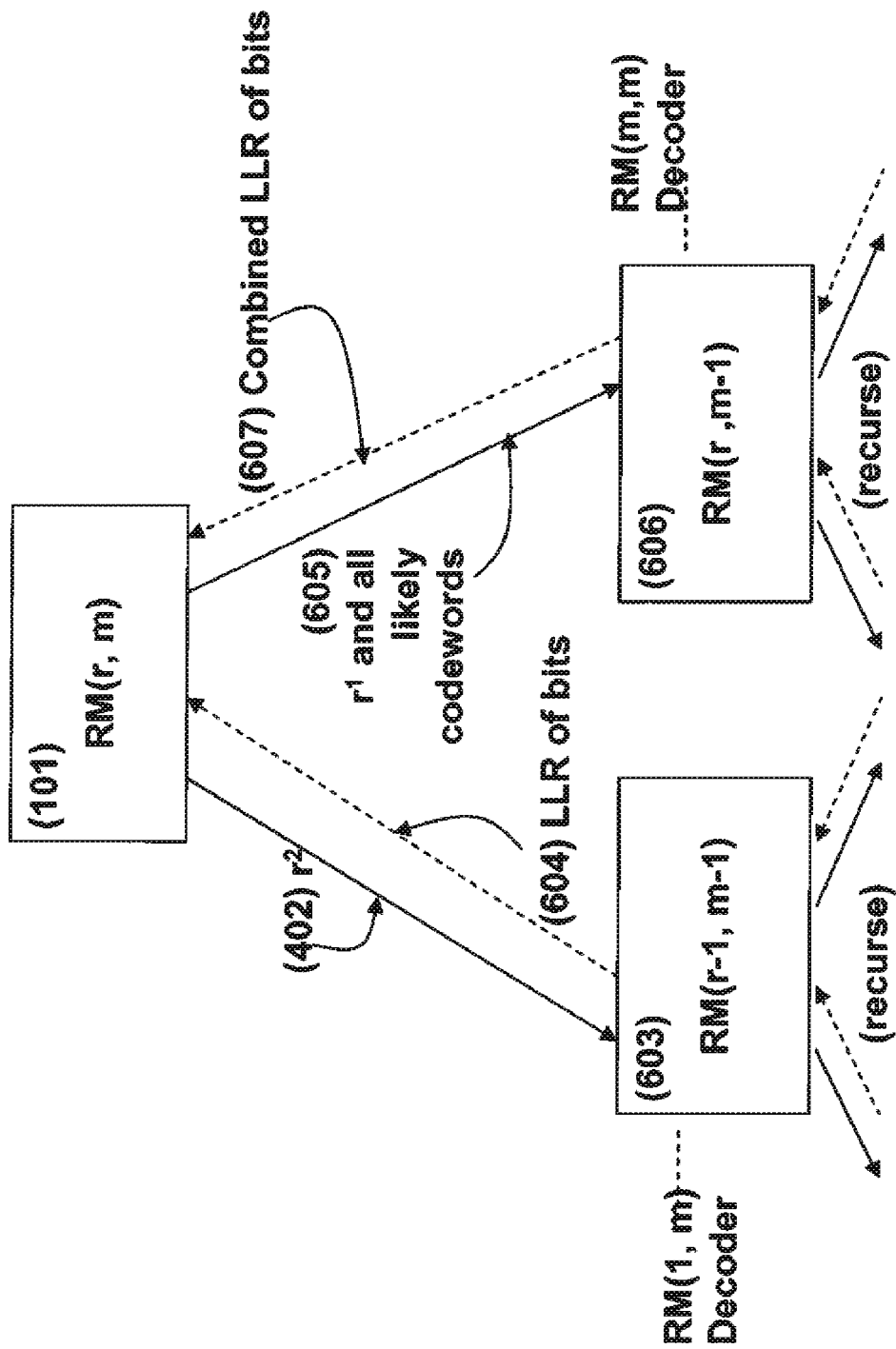
FIG. 6 is a schematic of a MAP decoding method for Reed Muller codes according to another embodiment of the invention

FIG. 6 shows the decoding method for higher order RM code. The method is similar to a ML decoder. We highlight the difference in the following:

To determine 101 the optimal for optimal decomposition variable, we use $$\hat{j} = \arg\max_j \min_i |LLR(v_i^j)|.$$

The RM(r−1, m−1) 603 decoder only returns the LLR of the undecoded bits 604 corresponding to $r^2$.

Using the LLR of the bits, the method determines the likelihood of code words that result in $r^2$. We consider all code words that have substantial probability, for example, a probability higher than 0.01. These code word, which are bit-wise multiplied by $r^2$, gives a compensated received codeword that can be used to decode the remaining bits.

Additionally $r^1$ 605 can be used to decode the remaining bits. The decoder for RM(r, m−1) 606 is called for each possibility. To clarify, RM(r, m−1) is called at least two times, and can be called many more times if many code words have the substantial probability.

The LLR of each recursive call determines the LLR of bits corresponding to the specific compensated codeword or $r^1$.

All LLR of bits are combined 607. First, using the probability of each compensated code word with the substantial probability, The LLR of bits can be determined using a weighted sum. Finally, the LLR of bits from $r^1$ is added to the LLR from the compensated code words.

MAP Decoder Using ML List Decoder

For a faster MAP decoder, it is possible to use the ML list decoder described above for FIG. 4. The list decoder returns the small number of code words that are most likely given the observed signal. Now, each codeword corresponds to an input bit pattern. With a small number of likely code words, a small number of likely input bit pattern are identified. An approximated MAP can then be calculated by considering a weighted sum of these likely bit patterns.

This code can be used in optical fiber, wireless, and wired communication networks.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for performing soft decision decoding of a codeword of a Euclidean a space Reed-Muller (RM) code, wherein a code RM(r, m) of order r and a codeword of length $2^m$ is a set of all binary vectors associated with coefficients of a Boolean polynomial with m variables, and whose terms are composed of monomials of degree r, comprising the steps of:

selecting an optimal decomposition variable i using a likelihood calculation;

expressing the code RM(r, m) as {(u, uv)|u∈RM(r, m−1) and v∈RM(r−1, m−1)}, where uv denotes a componentwise multiplication of u and v, and (u, uv)=($r^1$, $r^2$);

separating receive codeword into $r^1$=u and $r^2$=uv based on the optimal decomposition variable;

decoding $r^2$, according to the optimal decomposition variable, using a RM(r−1, m−1) decoder to obtain a decoded v and a first set of decoded bits;

combining the decoded v with $r^1$ using ($r^1$+$r^2$ v)/2; and decoding ($r^1$+$r^2$ v)/2 using a RM(r, m−1) decoder to obtain a decoded u and a second set of decoded bits, wherein the steps are performed in a processor.

2. The method of claim 1, wherein the selecting determines a log likelihood ratio of v, and uses absolute and maximum operations.

3. The method of claim 1, wherein the selecting uses a sum operation.

4. The method of claim 1, wherein the selecting uses a minimum operation.

5. The method of claim 1, wherein the decoding of the RM(1, m) code uses a Hadamard transform to obtain a maximum likelihood (ML) estimate of a transmitted codeword.

6. The method of claim 5, wherein the decoding of the RM(1, m) code uses a list Hadamard transform for a plurality of most likely decoded v.

7. The method of claim 1, wherein a RM(m, m) code is decoded by a matrix inversion.

8. The method of claim 5, wherein a RM(1, m) code is decoded using the Hadamard transform to obtain a Maximum A Posteriori (MAP) estimate of the transmitted information bit in the codeword.

9. The method of claim 7, further comprising:

determining the likelihood of each codeword based on received vector, decoding the RM(m, m) code using the matrix inversion to obtain a Maximum A Posteriori (MAP) estimate of a transmitted information bit in the codeword.

10. The method of claim 9, further comprising:

determining a probability of valid codewords based on the MAP estimate of the transmitted information bit at an output of the RM(r−1, m−1) decoder; and selecting a most likely codeword from the output of the RM(r−1, m−1) to combine with $r^1$.

11. The method of claim 10, further comprising:

determining the MAP estimate of the information bit using a weight sum operation.

* * * * *